US010454468B1

United States Patent
Estrada et al.

(10) Patent No.: US 10,454,468 B1
(45) Date of Patent: Oct. 22, 2019

(54) METHOD AND APPARATUS FOR BAND-GAP BASED POWER-ON-RESET INCLUDING FAST, LOW POWER AND ACCURATE BROWNOUT DETECTION

(71) Applicant: Vidatronic Inc., College Station, TX (US)

(72) Inventors: Luis Angel Tellez Estrada, College Station, TX (US); Anand Veeravalli Raghupathy, Plano, TX (US)

(73) Assignee: Vidatronic, Inc., College Station, TX (US)

( * ) Notice: Subject to any disclaimer, the term of this patent is extended or adjusted under 35 U.S.C. 154(b) by 0 days.

(21) Appl. No.: 16/188,162

(22) Filed: Nov. 12, 2018

(51) Int. Cl.
*H03K 5/22* (2006.01)
*H03K 17/22* (2006.01)
*G01R 19/165* (2006.01)
*G05F 3/08* (2006.01)

(52) U.S. Cl.
CPC ..... *H03K 17/223* (2013.01); *G01R 19/16552* (2013.01); *G05F 3/08* (2013.01)

(58) Field of Classification Search
CPC .... H03K 17/223; H03K 17/22; H03K 5/2481; H03K 5/08; H03K 3/0375; G01R 19/16552; G05F 3/08; G06F 1/24
See application file for complete search history.

(56) References Cited

U.S. PATENT DOCUMENTS

| 7,675,331 B2 * | 3/2010 | Jung | H03K 3/356008 327/142 |
| 2016/0274618 A1 * | 9/2016 | Baurle | G05F 5/00 |

* cited by examiner

*Primary Examiner* — Long Nguyen
(74) *Attorney, Agent, or Firm* — Liang Legal Group, PLLC

(57) ABSTRACT

A power-on reset (POR) circuit with an auxiliary control circuit and an enhanced resistor ladder for brownouts circuit detectors in low power applications includes a power-up detector circuit for detecting power supply ramp-up while charging; a brownout detector circuit for sensing power supply falling down; a set-reset (SR) latch to generate a power-on-reset (POR) signal; a start-up network; and an internal band-gap voltage reference circuit, wherein the internal band-gap voltage reference circuit is configured to be started by the start-up network to serve as a reference for the power-up detector circuit.

11 Claims, 10 Drawing Sheets

METHOD AND APPARATUS FOR BAND-GAP BASED POWER-ON-RESET INCLUDING FAST, LOW POWER AND ACCURATE BROWNOUT DETECTION

BACKGROUND

Performance and correct functionality of integrated circuits (ICs) are linked to the voltage level of the power supply. Coming from a discharged or dead battery, the power supply may take some time to reach an adequate voltage level to provide enough headroom for the sub-circuits to work. The main functionality of a Power-on-reset (POR) circuit is to sense the power supply and to provide a discrete time signal that informs the rest of the sub-circuits when the levels are adequate for proper operation (Vpu) (shown as 102 in FIG. 1). Furthermore, POR circuits can be designed to detect fast undershoots or brownout events in the power supply voltage level that goes below the operational thresholds (Vpd) (shown as 101 in FIG. 1).

FIG. 2 shows a prior art POR circuit (200) that detects the power-up (Vpu) and brownout (Vpd) voltage levels using two comparators (204, 205). The comparators (204, 205) compare two voltages coming from a resistive voltage divider, composed of three resistors (201), (202), and (203), with a fixed voltage reference (vref). The output of each comparator drives a set-reset latch (SR latch) (206) to provide a digital signal that indicates when the power supply is or is not ready for proper operations.

During the power supply ramp-up, comparator cmp_b (205) senses the power supply transition through the voltage node between Rb (202) and Rc (203). This node is compared with the fixed voltage reference, most likely a band-gap voltage reference, flipping the cmp_b output from low to high state and setting the SR latch (206). In parallel, comparator cmp_a (204) flips its output state in a complementary manner. During brownout events, cmp_a (204) detects the ramping down of the supply to reset the SR latch (206). As a result, the output of the POR is flipped, informing the rest of the IC that the voltage level is below the proper level for operations. The window hysteresis can be adjusted by the values assigned to Ra (201), Rb (202), and Rc (203).

The dependency on a fixed voltage reference in the prior art architectures is necessary for the correct functionality of the comparators. The prior art circuit (200) in FIG. 2 does not sense the state of the voltage reference signal Vref and assumes a fixed voltage for power-up comparison. However, this assumption may not be valid, and an inexact comparison may occur if Vref has not fully settled at the comparison time. Furthermore, the SR latch (206) inputs in FIG. 2 lack an initial condition during the power supply ramp-up, and this may corrupt the SR latch (206). Additionally, the prior art architecture (200) in FIG. 2 doesn't consider the non-idealities of resistors Ra (201), Rb (202), and Rc (203), in which the impedance values are a concern when the power supply ramps down at high speed during brownout events.

While the prior art architectures can provide useful power-up and brownout detection circuits, there is still a need for better approaches that can reduce power consumption for low power applications.

SUMMARY

Embodiments of the invention relate to start-up networks that can overcome erroneous comparisons during the band-gap voltage reference initial settling time and can prevent the SR latch from being corrupted during power-up events. During the power supply ramp-up, the initial condition of many sub-circuits inside the POR circuit is unknown. This undesirable condition affects and limits the POR circuit's voltage detection accuracy during power-up events. To overcome non-idealities of the resistor ladder, a frequency compensation technique, according to embodiments of the invention, may be used to enhance prior art resistor ladder's voltage detection accuracy during fast brownout events. In accordance with some embodiments of the invention, a POR circuit may include an OFF condition for one or more sub-circuits after the power-up event to reduce the POR power consumption.

In one aspect, embodiments of the invention relate to POR circuits. A POR circuit of the invention may include an internal band-gap voltage reference, a start-up network, a power-up detector circuit, comprising a pull-down network and a first RC delay, for detecting power supply ramp-up while charging, a brownout detector circuit for sensing power supply falling down, and an SR latch output stage for generating a power-on-reset (POR) signal.

The start-up network has an output coupled to a first input of the pull-down network, a second input of the first RC delay, and a third input of the SR latch, wherin the third input of the SR latch is configured as an alternative reset signal at the beginning of the power supply ramp-up. The internal band-gap voltage reference circuit having an output coupled to a first input of a first resistor ladder and a first input of a first comparator in the power-up detector circuit, wherein a first input of the internal band-gap voltage reference circuit couples with the first input of the start-up network, wherein the internal band-gap voltage reference circuit is configured to be started by the start-up network to serve as a reference for the power-up detector circuit.

In accordance with embodiments of the invention, a start-up network may rely on a first resistor, a first capacitor, and a first NMOS switching device, which is configured to produce a pulse signal for use as an initial condition for the POR SR latch circuit, to avoid an undefined state or meta-stability, wherein the NMOS switching device is configured to sense the state of an internal band-gap voltage reference and to determine the time period to perform a voltage comparison after the voltage reference reaches the steady state.

In accordance with embodiments of the invention, a power-up detector circuit may include a first resistor ladder, a first RC delay circuit, and a first comparator. The first resistor ladder is configured to sense the power supply power-up voltage level and to provide a voltage reference to a first comparator, wherein the first resistor ladder ON/OFF state is controlled by a PMOS switching device and an NMOS switching device, which couple the first resistor ladder to the power supply and ground, respectively. The first RC delay circuit is configured to couple the voltage reference coming from the first resistor ladder to the first comparator, wherein the first RC delay circuit coupling time is controlled by the first start-up network for proper comparison between the internal voltage reference and the reference coming from the first resistor ladder. The first comparator is configured to set the first Set-Reset (SR) latch circuit, wherein the first comparator ON/OFF state may be controlled by a switching device for power savings.

In accordance with embodiments of the invention, a power-up detector circuit may include a pull-down network circuit. A pull-down network circuit of the invention may include multiple NMOS switching devices, wherein the NMOS switching devices are controlled by the start-up network, the output state of the SR latch, and the output state of the brownout detector circuit, and wherein the NMOS switching devices are configured to pull-down internal nodes of the power-up detector circuit to prevent any wrong state at the set node of the SR latch during the power supply ramp-up and during the OFF condition of the first comparator in the power-up detector circuit.

In accordance with embodiments of the invention, a brownout detector circuit of the invention includes a first enhanced resistor ladder configured to sense fast brownout events and to provide a voltage reference to a second comparator, wherein the first enhanced resistor ladder ON/OFF state is controlled by an NMOS switching device, and the second comparator is configured to reset the first SR latch circuit.

In accordance with embodiments of the invention, an SR latch circuit of the invention includes a set input controlled by a power-up detector circuit, a reset input controlled by a brownout detector circuit, a clear input, which is configured as an alternative reset signal and wherein the alternative reset signal is controlled by a start-up network output signal to provide an initial reset state at the beginning of the power supply ramp-up, two complementary outputs configured to couple the SR latch set-reset state to the first resistor ladder and the first comparator in the power-up detector circuit, and the first enhanced resistor ladder in the brownout detector circuit, wherein the SR latch outputs may control the ON/OFF state of the internal circuits of the POR circuit.

Non-idealities from parasitic capacitances of a resistor ladder may affect the voltage detection speed during fast brownout events, resulting in an inaccurate voltage comparison. This degradation becomes worse in low power applications, when large resistors are implemented for power reduction, and thus the resistors include large parasitic capacitors that can slow down the system operation.

In one aspect, embodiments of the invention relate to a method for enhancing the frequency response of a large resistor ladder, wherein the large resistor ladder is configured to provide an accurate voltage reference for brownouts circuit detectors in POR applications. An enhanced resistor ladder of the invention configured to detect brownout events may make use of the parasitic capacitance associated with the resistor by coupling the resistor's well connection to the power supply. The enhanced resistor ladder of the invention for brownout detection may include a first capacitor that couples the power supply to the voltage divider node and may be configured to generate a left-half plane (LHP) zero, and a second capacitor coupling the output node of the voltage divider and configured to adjust an LHP pole, wherein both the first and the second capacitors may be adjusted to enhance the resistor ladder by increasing the frequency response.

BRIEF DESCRIPTION OF DRAWINGS

The appended drawings illustrate several exemplary embodiments of the invention and should not be considered limiting the scope of the invention, because other modifications and equivalent embodiments are possible.

DETAILED DESCRIPTION

Figure 1:
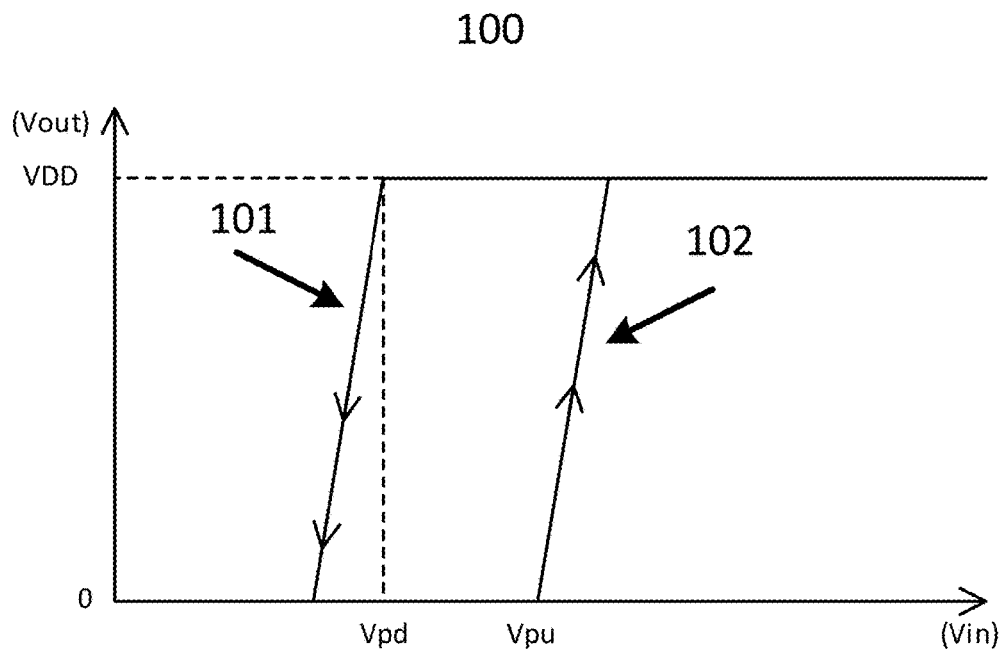
FIG. 1 shows an example hysteresis window of a POR output.

Aspects of the present invention are shown in the above drawings and are described below. In the description, like or identical reference numerals are used to identify common or similar elements. The drawings are not necessarily to scale, and certain features may be shown exaggerated in scale or in schematic in the interest of clarity and conciseness.

Embodiments of the invention relate to an improved power-on-reset (POR) circuit with an auxiliary control circuit and an enhanced resistor ladder for brownouts circuit detectors in low power applications. In accordance with embodiments of the invention, a POR circuit may comprise an internal band-gap voltage reference, a start-up network, a power-up detector circuit, a brownout detector circuit, and an SR latch output stage. In accordance with embodiments of the invention, a start-up network, which comprises an RC pull-up network and an NMOS switch device controlled by an internal band-gap voltage reference, may be used to provide the correct initial condition for an SR latch during the power supply ramp-up. In one or more embodiments of the invention, the start-up network in parallel with an RC delay circuit may be used to provide the correct timing conditions for the correct comparison between a voltage reference coming from a resistor ladder and an internal band-gap voltage reference. In one or more embodiments of the invention, an auxiliary pull-down network, which comprises logic gates and pull-down devices, may be used to prevent any wrong state at the set node of the SR latch during the power supply ramp-up and down transitions.

In one or more embodiments, an enhanced brownout resistor ladder may be used to improve the speed of brownout events by coupling the well connection of the resistor's segments to the power supply. In one or more embodiments, an additional compensation capacitor connected from the power supply to the voltage divider node may be used to further improve the frequency response of the resistor ladder.

An objective of improved POR circuits of the invention is to produce improved methods and circuits to achieve the correct comparison for power-up and brownout events while preventing corruption of the input state of the SR latch and the detection of fast brownout events in low power applications. In one or more embodiments of the invention, the POR architecture with control circuits and an enhanced resistor ladder may be implemented on a microchip, such as a semiconductor integrated circuit (IC). Throughout this disclosure, the term "POR circuit" and "power-on-reset circuit" may be used interchangeably based on the context.

Figure 3A:
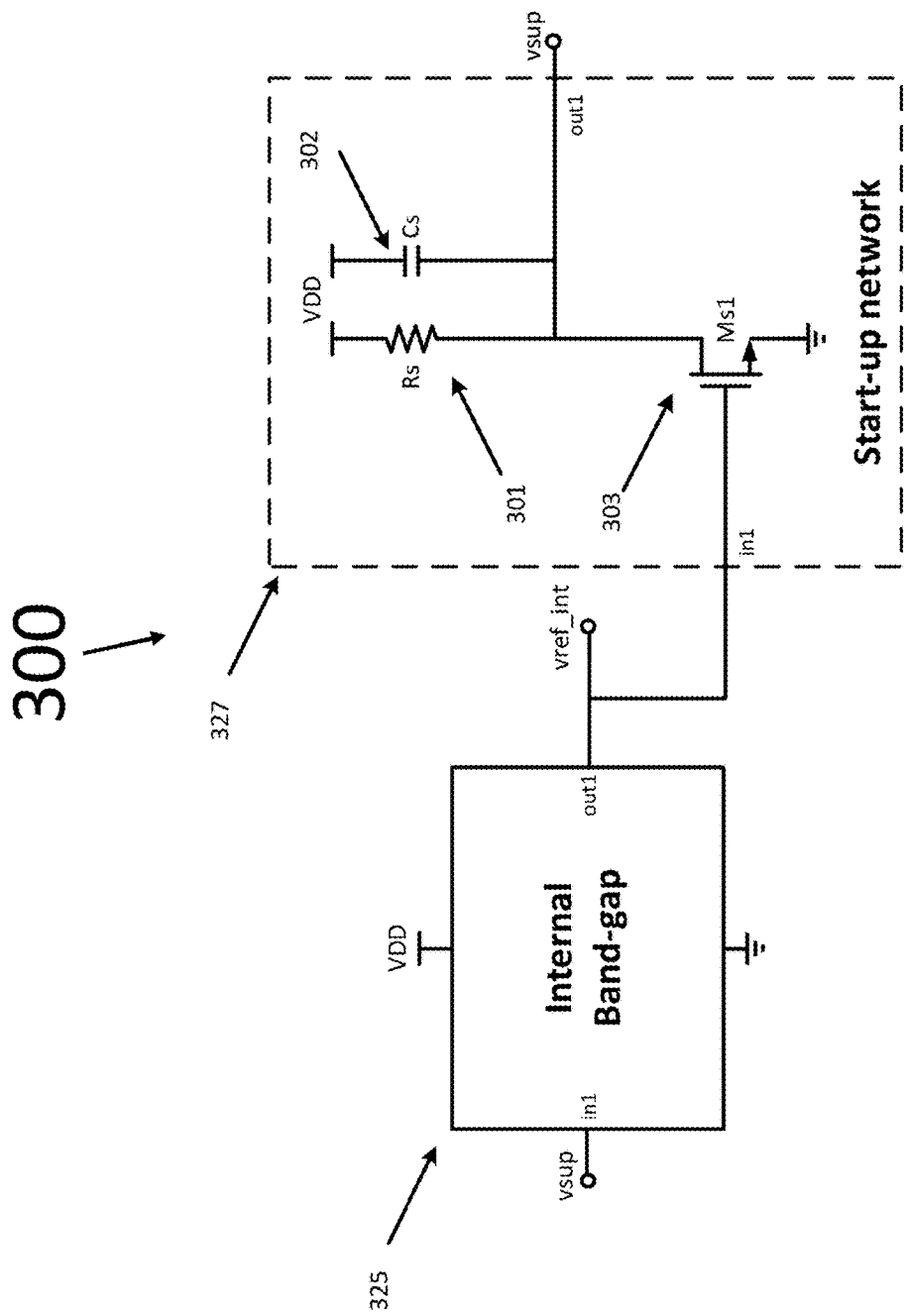
FIGS. 3(A)-3(C) show an example circuit diagram of a POR circuit comprising an internal band-gap voltage reference, a start-up network, a power-up detector circuit, a brownout detector circuit with an enhanced resistor ladder, and an output stage composed of an SR latch, according to one embodiment of the invention.
Figure 3B:
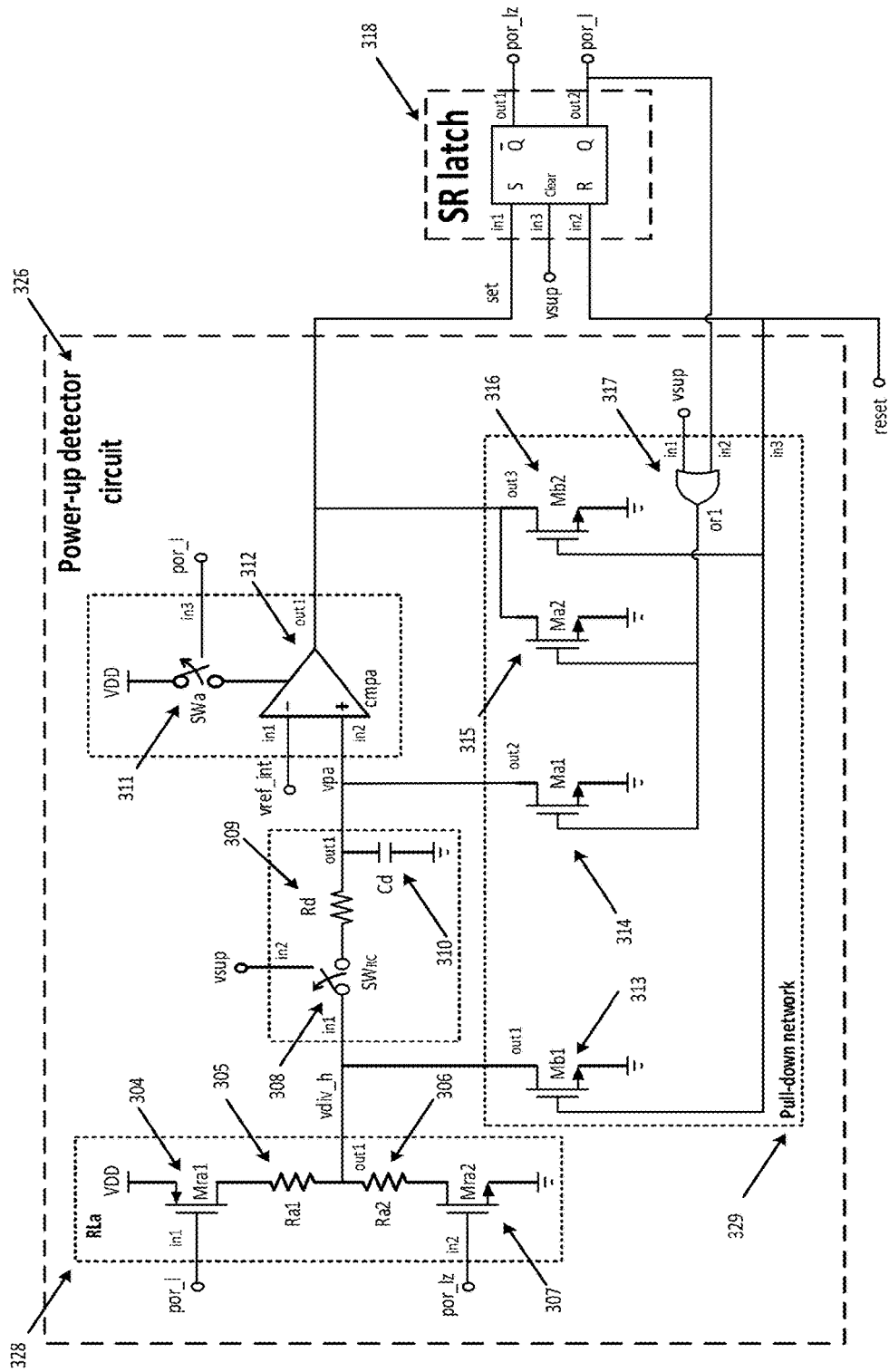
Figure 3C:
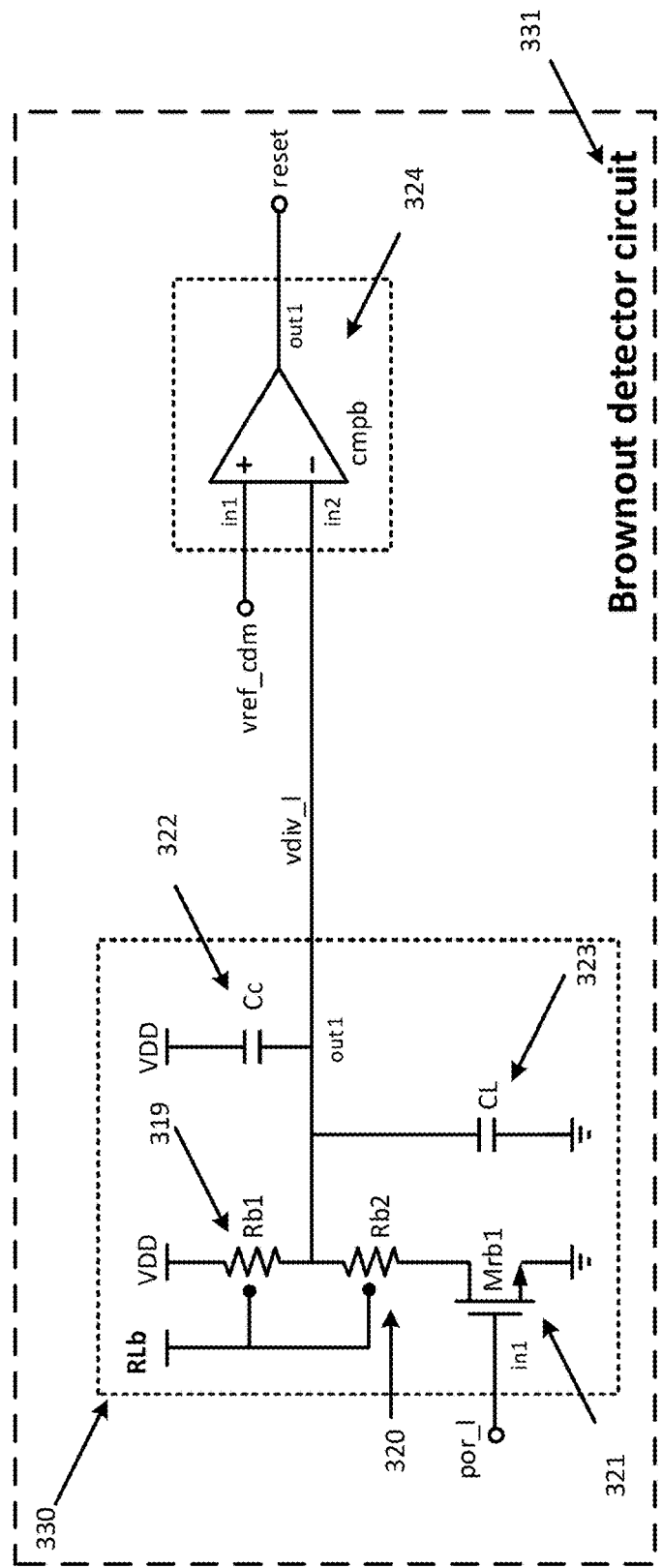

In accordance with embodiments of the invention, FIGS. 3(A)-3(C) show an exemplary circuit implementation of a power-on-reset (POR) circuit (300) having an internal band-gap voltage reference (325), a start-up network (327), a power-up detector circuit (326), a brownout detector circuit (331), and an SR latch output stage (318).

The start-up network (327) may be used to provide an initial condition for the SR latch (318). The power-up detector circuit (326) senses the power supply through an RLa resistor ladder (328), and an RC delay circuit ((309) and (310)) gives the timing condition to couple the voltage reference from a resistor divider, composed of Ra1 (305) and Ra2 (306), in the RLa resistor ladder (328) to the positive terminal of the comparator cmpa (312) for a correct comparison with a vref_int signal from the internal band-gap voltage reference (325). After the power-up event, the RLa resistor ladder (328) and the cmpa comparator (312) may be turned off to conserve power.

In accordance with one or more embodiments of the invention, a pull-down network (329) may be inserted in the power-up detector circuit (326) to control different internal nodes during the ramp-up and after the power-up event. Details and operations of the pull-down network (329) will be described with reference to FIG. 4 (400) below.

As shown in FIG. 3(C), the brownout detector circuit (331) may be used to sense the power supply through the RLb resistor ladder (330) for any brownout event. In accordance with one or more embodiments of the invention, an enhanced resistor ladder may be implemented to provide fast voltage detection during brownout events in low power conditions, providing an accurate voltage level to the brownout comparator cmpb (324). Details of the enhanced resistor ladder are described with reference to FIG. 12 (1200) below.

Figure 4:
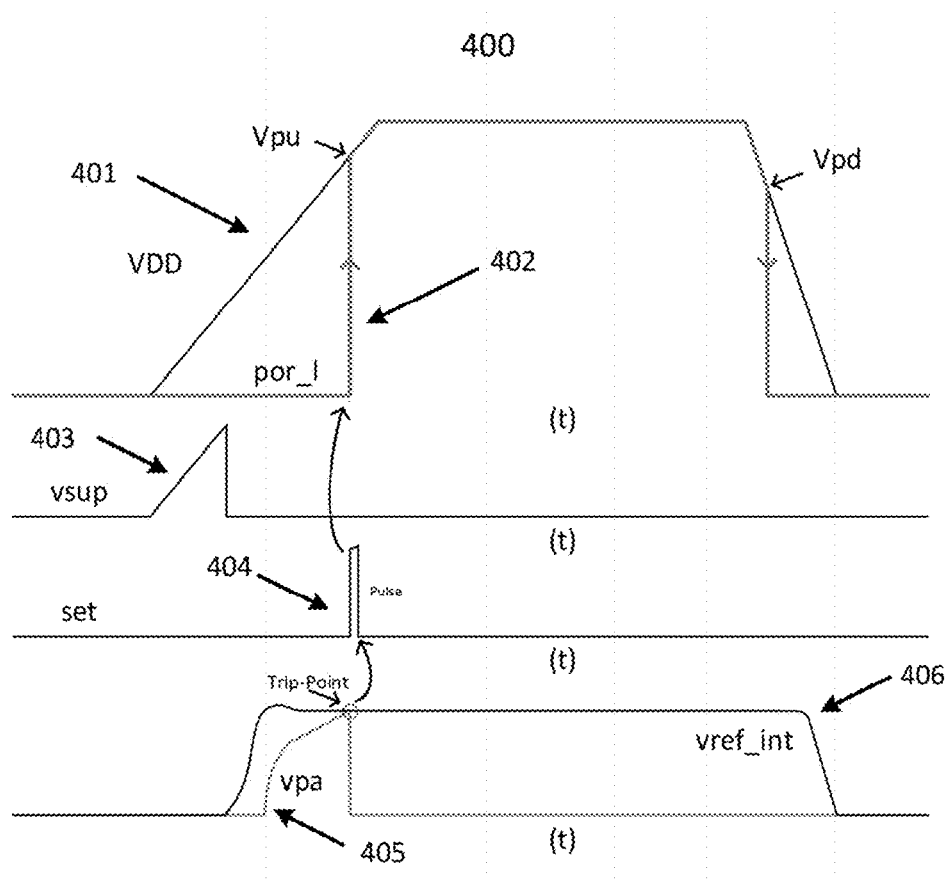
FIG. 4 shows an example waveform of the power-up event of the POR circuit shown in FIGS. 3(A)-3(C).

FIG. 4 (400) shows an example of the internal signal waveforms during a power-up event. The following discussion refers to FIG. 3(B) and FIG. 4. The power-up sequence starts with the start-up network (327), which generates a vsup signal (403). During the power supply ramp-up (401), the vsup signal (403) is pulled up to the power supply by Rs (301) and Cs (302) and subsequently pulled down by Ms1 (303) transistor after vref_int (406) reaches steady state. During this time, transistors Ma1 (314) and Ma2 (315), which are controlled by the OR gate or1 (317), pull down the positive terminal and the output of comparator cmpa (312), respectively, forcing a low initial condition at the set node of the SR latch (318). The clear input of the SR latch (318) is controlled by vsup (403) at the beginning of the ramp-up to initialize the output por_l (402) of the SR latch (318) at low state resulting in a reset initial condition. The por_l (402) low state permits SWa (311) to turn on cmpa (312) and the two devices Mra1 (304) and Mra2 (307) to connect the RLa resistor ladder (328) terminals to the power supply and ground, respectively. Because vsup (403) is high, vpa node (405) is pulled down by Ma1 (314), and the $SW_{RC}$ switch (308) remains open waiting for vref_int (406) to reach steady state. It is important to mention that the positive terminal of comparator cmpb (324) remains in low state during this time and the negative terminal is pulled-up to the power supply. Therefore, no reset signal is generated by the brownout detector circuit (331). After vref_int (406) voltage reaches steady state, vsup (403) goes low and the SR latch (318) enters a hold state. Transistors Ma1 (314) and Ma2 (315) are released, and $SW_{RC}$ (308) switch is closed coupling the voltage level from RLa (328) resistor ladder to the RC delay circuit permitting vpa (405) to follow the RLa (328) voltage level. The comparator cmpa (312) compares vref_int (406), coming from the internal band-gap voltage reference (325), with vpa node (405) flipping its output state from low to high and setting the SR latch (318) into a set state (404) when vpa (405) reaches the trip-point, causing por_l (402) to go high. After the power-up event the por_l (402) signal is fed back to the RLa resistor ladder (328), disconnecting it from the power supply and ground to avoid additional power consumption. Likewise, the por_l (402) signal opens SWa (311) turning off cmpa (312) comparator for power reduction. Ma1 (314) and Ma2 (315) are activated again pulling down the positive and the output terminals of the cmpa (312) comparator respectively to avoid floating nodes. The set (404) node is put to a low state and the SR latch (318) enters a hold state waiting for a reset signal which will be generated by the brownout detector circuit.

Figure 5:
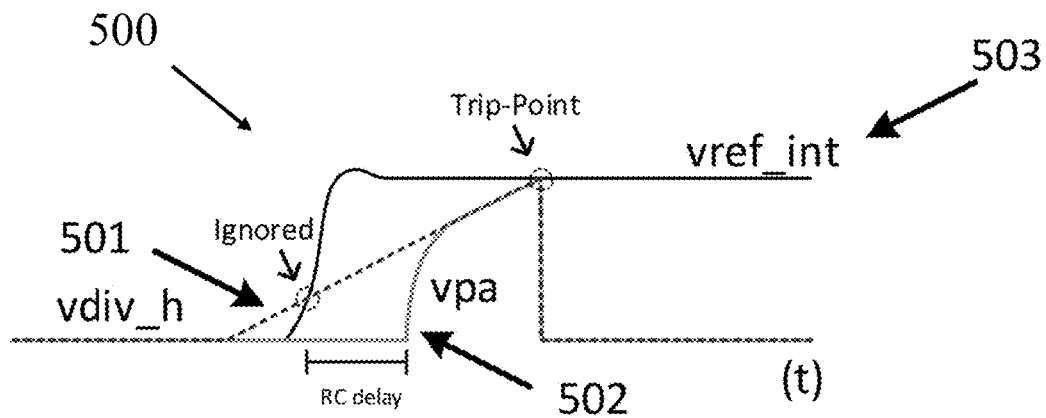
FIG. 5 shows interactions of internal nodes in the power-up detector circuit during the power-up event of the POR circuit shown in FIGS. 3(A)-3(C).

FIG. 5 (500) shows the interactions between the voltage reference coming from the RLa (328) resistor ladder, the RC delay circuit ((309) and (310)), and the positive terminal of the cmpa comparator (312) during a power-up event. During the power supply ramp-up, the linear increment of the vdiv_h (501) node crosses vref_int (503) voltage level twice. As a result, an unwanted change in the cmpa comparator (312) can be produced if the node vdiv_h (501) is directly connected to its positive terminal. To avoid incorrect crossing points at the beginning of the ramp-up, an RC delay ((309) and (310)) is implemented after the $SW_{RC}$ (308) switch. This delay time allows cmpa (312) to compare vpa node (502) with vref_int (503) after this last one reaches steady state. The RC value may be adjusted such that vpa node (502) charging time starts after vref_int (503) is above the first crossing point (ignored) between vdiv_h (501) and vref_int (503) and ends before the desired trip-point. It is worth pointing out that compared to the prior art in FIG. 2 (200), the implementation of the switch $SW_{RC}$ (308) plus the RC delay ((309) and (310)), Ma1 (314), Ma2 (315), and Mb2 (316) are differentiating features in this architecture. These features ensure that the issue of multiple trip events during power-up ramp is avoided, and that the SR latch (318) states are set correctly during ramp-up. Further, the switches Mra1 (304), Mra2 (307), and Mb1 (313) are key features in this architecture to save power consumption in the resistor ladder, after the POR signal has been asserted to indicate that the power-up event is complete.

Figure 6:
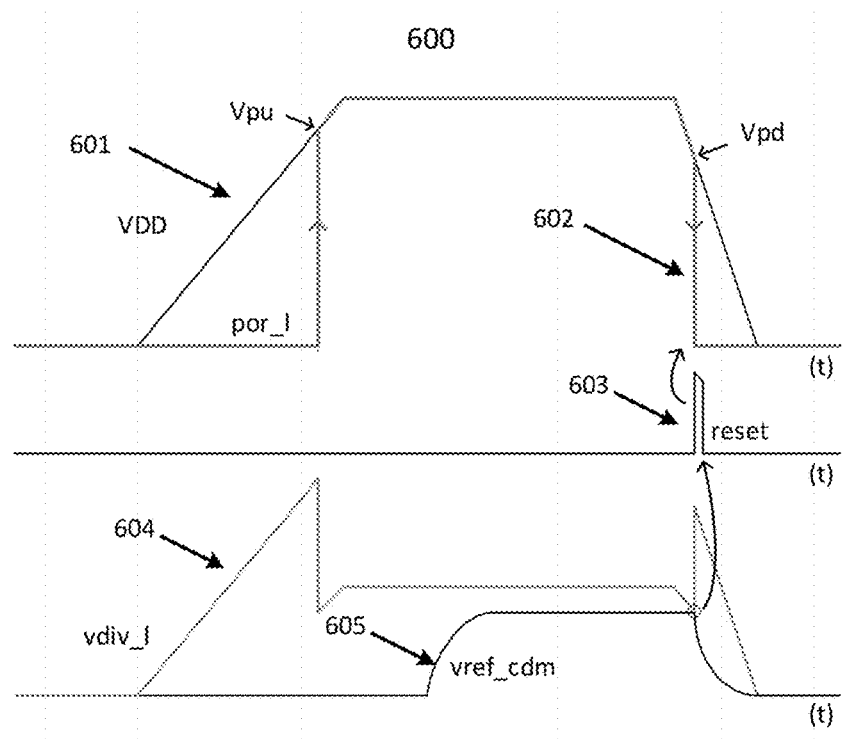
FIG. 6 shows an example waveform of the brownout event of the POR circuit shown in FIGS. 3(A)-3(C).

FIG. 6 (600) shows an example of internal signal waveforms during a power-up and brownout event and the interactions of each node in the brownout detector circuit (331) of FIGS. 3(A)-3(C) during the ramping down of the power supply. At the beginning of the ramp-up, the vref_cdm (605), coming from an external voltage reference, is still in low condition until the power-up event is complete. Initially, the node vdiv_l (604) between Rb1 (319) and Rb2 (320) in the RLb (330) resistor ladder is pulled-up to VDD (601) due to the low condition of por_l (602) and the OFF condition of switch Mrb1 (321). After Vpu (102) is reached, RLb (330) starts sensing the power supply for any brownout event that goes beyond the Vpd (101) threshold. This configuration avoids any reset signal before the power-up event happens. After the power supply reaches steady state, the POR circuit enters a hold state waiting for a brownout event. During this time comparator cmpa (312) and the RLa (328) resistor ladder circuits are completely off reducing power consumption. After some time, vref_cdm (605) achieves its nominal value and provides an accurate voltage reference to the positive terminal of cmpb (324) comparator comparing vref_cdm (605) with vdiv_l (604) for any brownout event. Signal vdiv_l (604) decreases as the power supply goes low until it reaches the vref_cdm voltage level (605). This condition changes the state of cmpb (324) producing a reset signal (603) at the SR latch (318) input and a low state in the por_l signal (602). After the brownout event detection, transistors Mb1 (313) and Mb2 (316) pull down the vdiv_h node and the output of cmpa (312), respectively, to prevent a set pulse from occurring while the reset node is high. Once por_l (602) is in a low condition, switch Mrb1 (321) is off and RLb (330) is disconnected from ground, pulling vdiv_l (604) to VDD (601). The reset terminal (603) goes low again, and transistors Mb1 (313) and Mb2 (316) are off. In parallel, cmpa (312) and resistor divider RLa (328) are activated again, and the SR latch (318) enters a hold state. The power-up detector circuit is ready to detect the next power-up event.

Like power-up events, brownout events can occur in two different situations, slow and fast events. Slow brownout events usually happen due to the discharge process of the battery or the turn-off process of the IC. Brownout events also happen when an excessive amount of current is needed due to an increment in the load or a failure in the system. These events generate undershoots in the power supply voltage level in a very fast rate demanding fast circuit designs to detect them, increasing power consumption. The RLb resistor (330) ladder in the brownout detector circuit (331) makes use of the resistor's segments well connections by coupling them to the power supply, resulting in an enhanced resistor ladder that can detect faster brownout events. In addition, capacitors Cc (322) and CL (323) are placed to further improve the speed of RLb ladder (330). It is important to mention that connecting the well to the power supply, and the addition of Cc (322) and CL (323) capacitors are differentiators compared to prior art designs based on resistor dividers and comparators, in which the frequency response of resistor dividers has not been fully exploited for POR designs.

Figure 7:
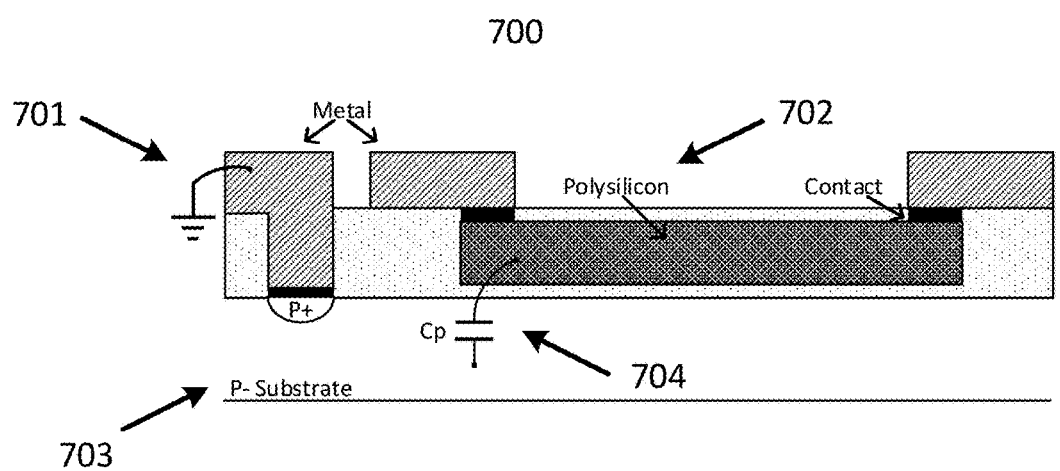
FIG. 7 shows an example layout cross-section view of a polysilicon resistor segment that is placed over a substrate, according to one embodiment of the invention.

FIG. 7 (700) shows an example of a layout cross section of a polysilicon resistor that is placed over the substrate (703) and not in a well. One of the major parasitic contributors is the capacitance between the resistor and the substrate Cp (704). Because Cp (704) is presented along each resistor segment (702) and couples to ground (701), the resulting capacitance is directly proportional to the total resistor area. In addition, circuits such as digital gates, digital or linear comparators, which are connected to any point of the resistor ladder, usually provide a significant load capacitance in the range of femtofarads or even picofarads, which increase the loading parasitic capacitance effect and can be even higher after layout extraction. As a result, the implementation of resistor ladders for voltage sensing introduces large time constants, which degrade the speed of voltage detection for fast brownout events in low power applications.

Figure 8:
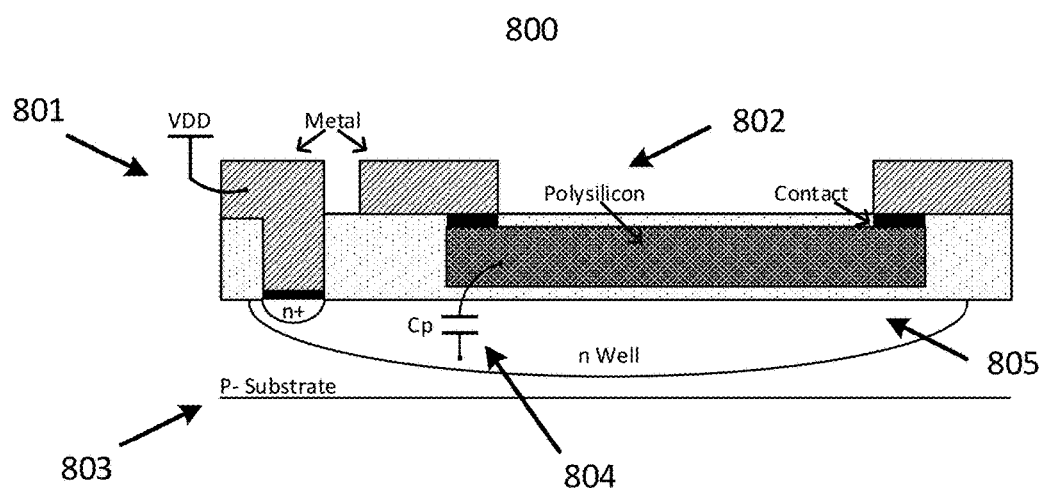
FIG. 8 shows an example layout cross-section view of a polysilicon resistor segment placed in a well with the well coupled to the power supply, according to one embodiment of the invention

FIG. 8 (800) shows an example of a layout cross section of a polysilicon resistor segment (802) that is placed in a well (805) and not directly over the substrate (803), with its well connected to VDD (801). This is different from the polysilicon resistor segment (702) of FIG. 7 (700) that is not placed inside a well (805). As a result, the parasitic capacitance Cp (804) can couple to a different potential, such as VDD.

Figure 9:
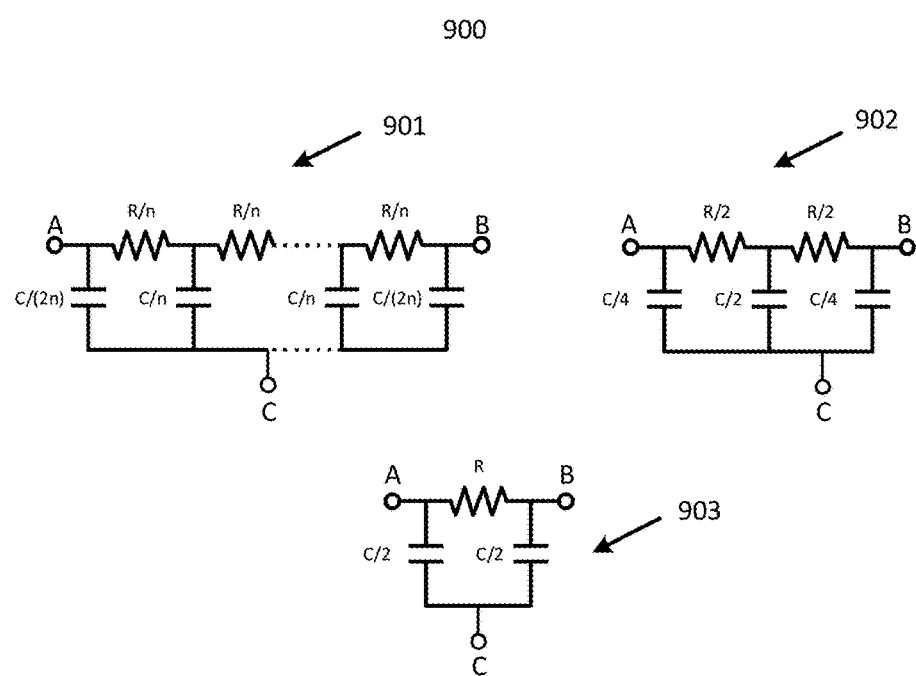
FIG. 9 shows examples of $\pi$ models of resistance segments with parasitic capacitances.

FIG. 9 (900) shows examples of three different π models. Due to the large resistance values in low power applications, each resistor is composed by the sum of small resistors segments and each of them introduces a parasitic capacitor Cp ((704) or (804)) couple to ground (701) as shown in FIG. 7 (700) or to VDD (801) as shown in FIG. 8 (800). To understand the effect of the parasitic capacitors on the resistor ladder, the following π models in FIG. 9 (900) are used, where a voltage divider with a large resistance value can be modeled by (901) and replaced by (902) or (903) to simplify the analysis.

Figure 2:
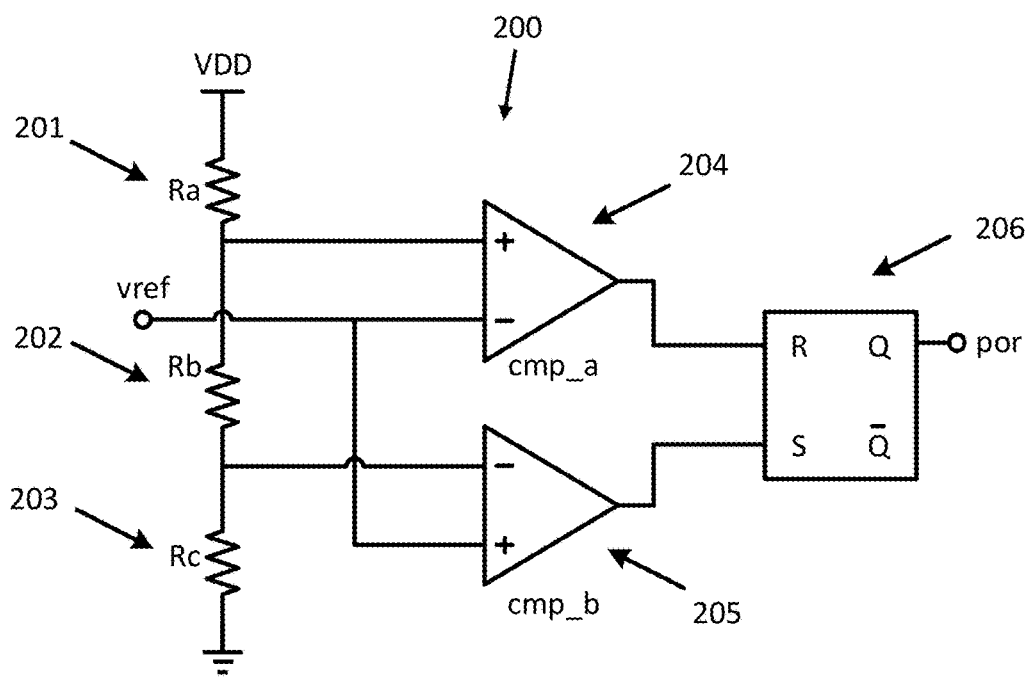
FIG. 2 shows a prior art POR circuit based on a voltage reference circuit, a resistor divider, and two comparators.
Figure 10:
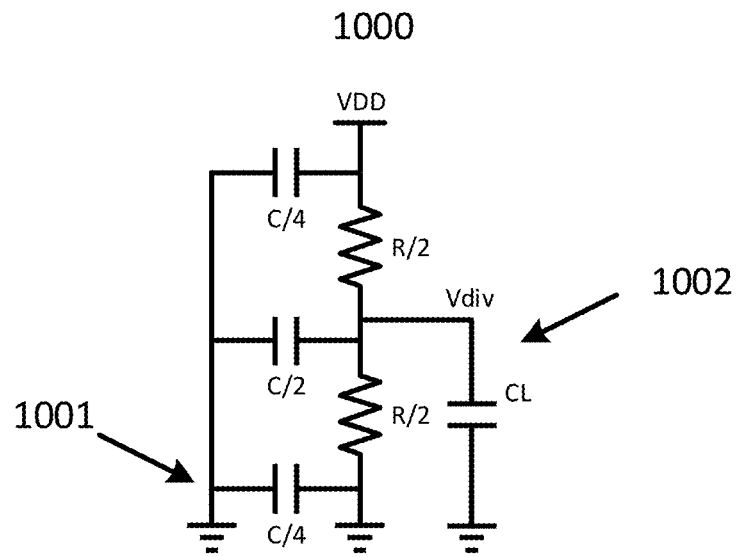
FIG. 10 shows an example circuit implementation based on the $\pi$ models of a voltage divider with the well connected to ground and an additional parasitic capacitance load.

FIG. 10 (1000) shows a prior art resistor ladder with a parasitic load CL (1002) usually implemented in prior art POR architectures in FIG. 2 (200), in which all the parasitic caps are coupled to ground (1001) and can be modeled using the π model (902) in FIG. 9 (900). A first order approximation shows that the frequency response of the resistor divider is given by Vdiv/VDD=½ *(1/(1+R/4*(CL+C/2)*s)), with a dominant pole given by $\omega_p$=4/(R*(CL+C/2)). Clearly, the frequency response is dominated by one pole that is proportional to the sum of the resistors segments, the sum of parasitic capacitances coupled to ground, and the load capacitance CL (1002). Increasing the value/area of the resistor for power reduction will increase the parasitic caps, and, therefore, the speed of the circuit is limited by the amount of power and the load capacitance.

Figure 11:
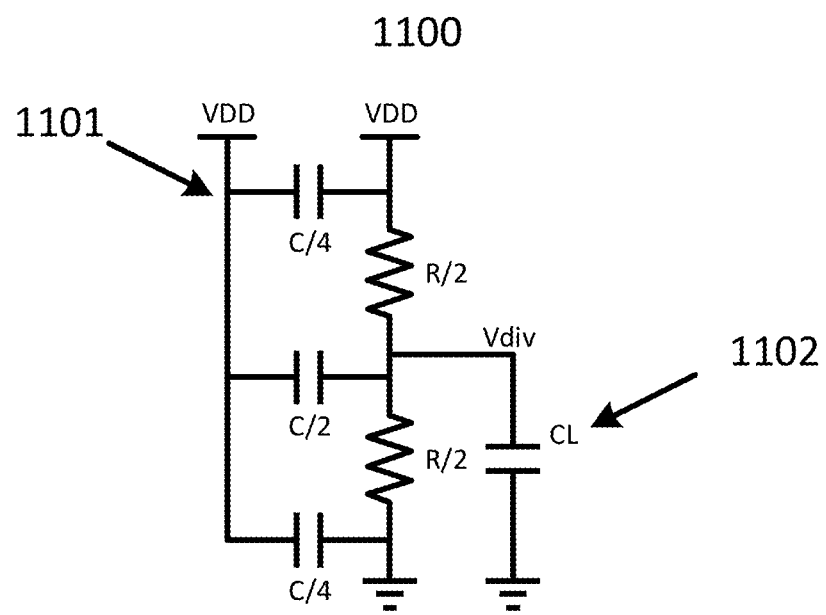
FIG. 11 shows an example circuit implementation based on the $\pi$ models of a voltage divider with the well connected to VDD and an additional parasitic capacitance load.

FIG. 11 (1100) shows an example for the resistor ladder RLb (330) implemented in FIG. 3(C) for fast brownout events detection, where all the resistor's well connections are coupled to the power supply, and a parasitic load capacitor is modeled by CL (1102). As shown in FIG. 11 (1100), all the parasitic caps are coupled to VDD (1101) and can be modeled using the π model (902) in FIG. 9 (900). The frequency response at the Vdiv node may be expressed as Vdiv/VDD=½ *((1+(RC/4)*s)/(1+(R/4*(CL+C/2))*s)), with a pole given by $\omega_p$=4/(R*(CL+C/2)) and a left half plane zero (LHP) given by co, =2/(R*C/2). The resulting resistor divider introduces an LHP zero in the frequency response and the same pole as the example in FIG. 10 (1000). Due to the large value of resistors segments and the fact that parasitic capacitances are proportional to the resistor area/size, the effect of the LHP zero can be comparable to the dominant pole or even dominant if load capacitances are very small.

Figure 12:
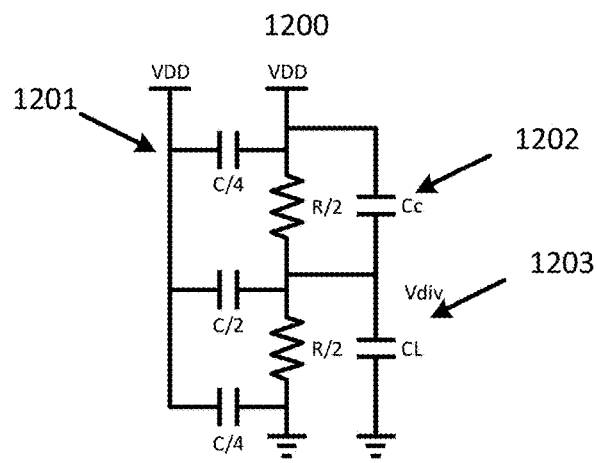
FIG. 12 shows the resistor divider of FIG. 11 with an additional Cc capacitor that improves detection during fast brownout events.

FIG. 12 (1200) shows another example resistor ladder using the method in FIG. 3(C) for fast brownout events detection with the resistor's well coupled to VDD (1201). An additional capacitor Cc (1202) is connected from VDD to Vdiv node to further improve the frequency response and the speed of detection of the brownout resistor ladder. The resulting frequency response is given by Vdiv/VDD=½ *((1+R/2*(C/2+Cc)*s)/(1+(R/4*(CL+C/2+Cc))*s)), with a pole at $\omega_p$=4/(R*(CL+C/2+Cc)) and a LHP zero at $\omega_z$=2/(R*(C/2+Cc)). The resulting pole and zero adds to its value the Cc capacitor (1202), which introduces a degree of freedom in the placement of the LHP zero to compensate the effect of the pole, since the parasitic capacitor value cannot be modified without altering the resistance value. It is important to mention, that Cc (1202) takes advantage of the significant value of the parasitic caps and the coupling connection to the power supply resulting in a small value and size area.

Figure 13:
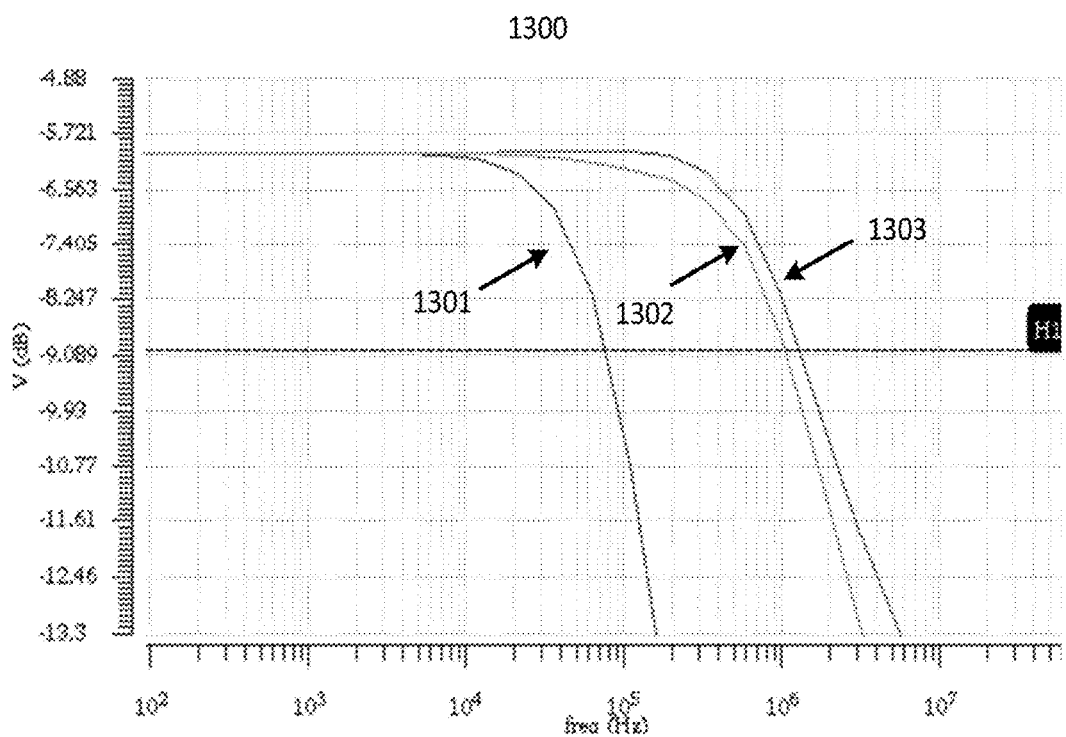
FIG. 13 shows the frequency responses of the resistor dividers of FIG. 10, FIG. 11, and FIG. 12.

FIG. 13 (1300) shows a comparison between a frequency response (1301) of the prior art resistor ladder (1000) and frequency responses (1302) and (1303) of the enhanced resistor ladders in FIG. 11 (1100) and FIG. 12 (1200), respectively, in accordance with embodiments of the invention. Using the same resistance value and same load capacitance CL ((1102) and (1203)), the enhanced resistor ladders frequency response (1302) and (1303) exhibit superior bandwidths, as compared with that of the prior art resistor ladder in FIG. 10 (1000). It is worth mentioning that a small value of Cc was introduced to further improve the frequency response of the enhanced resistor ladder of FIG. 11 (1100). The results show that the largest bandwidth (1303) is achieved by using the enhanced resistor ladder with the additional Cc (1202) compensation capacitor.

Figure 14:
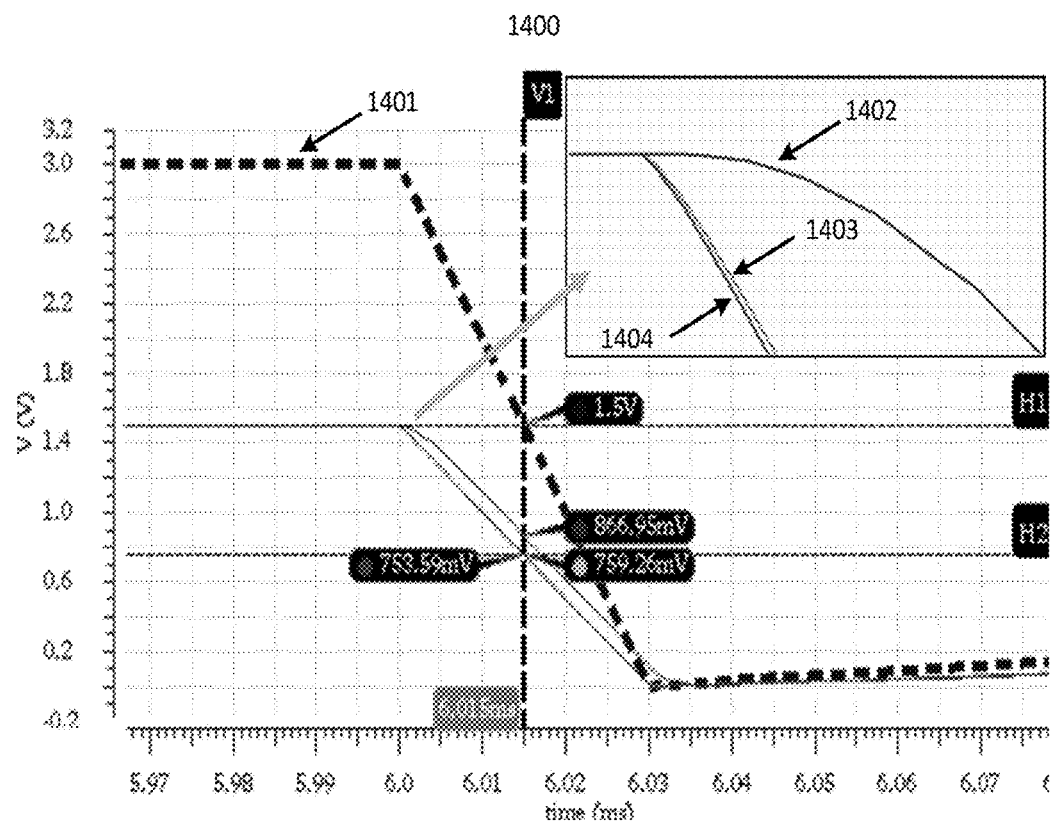
FIG. 14 shows the transient responses of the resistor dividers of FIG. 10, FIG. 11, and FIG. 12 during the power supply ramp down.

FIG. 14 (1400) shows transient responses of the three resistor ladders described above. Under the same load and voltage conditions, the best performance (1404) is observed using the enhanced resistor ladder with the additional Cc (1202) compensation capacitor in FIG. 12 (1200). Slightly slower response is observed (1403) for the ladder of FIG. 11 (1100) when the power supply (1401) ramps down. On the other hand, the prior art resistor ladder exhibits a very large delay at the beginning of the ramp down (1402), resulting in an inaccurate voltage level at the middle of the ramp time.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A power-on reset (POR) circuit, compromising:
   a power-up detector circuit for detecting power supply ramp-up, wherein the power-up detector circuit comprises a pull-down network and a first RC delay;
   a brownout detector circuit for sensing power supply falling down;
   a set-reset (SR) latch to generate a power-on-reset (POR) signal, wherein the SR latch comprises a first output and a second output serving as a control for multiple switches to connect or disconnect blocks for power savings;
   a start-up network having an output coupled to a first input of the pull-down network, a second input of the first RC delay, and a third input of the SR latch, wherein the third input of the SR latch is configured as an alternative reset signal at beginning of the power supply ramp-up; and
   an internal band-gap voltage reference circuit having an output coupled to a first input of a first resistor ladder and a first input of a first comparator in the power-up detector circuit, wherein a first input of the internal band-gap voltage reference circuit couples with the first input of the start-up network, wherein the internal band-gap voltage reference circuit is configured to be started by the start-up network to serve as a reference for the power-up detector circuit.

2. The POR circuit of claim 1, wherein output signals of the SR latch control an ON/OFF state of inputs of a first resistor divider and a first enhanced resistor divider, a third input of the first comparator, and a second input of the pull-down network to avoid an undesired set/reset state and for power reduction of the POR circuit.

3. The POR circuit of claim 1, wherein the start-up network is configured to generate a pulse that controls an initial state of the first RC delay, the pull-down network, and the SR latch at the beginning of the power supply ramp-up.

4. The POR circuit of claim 1, wherein the power-up detector circuit has a first resistor divider that has a first output coupled to a first input of the first RC delay circuit, wherein the first RC delay circuit has a first output coupled to a second input of the first comparator, and wherein the first comparator having a first output coupled to a first input of the SR latch.

5. The POR circuit of claim 4, wherein the first resistor divider is configured to sense a power supply during a power-up event, and wherein two different inputs of the first resistor divider control a connection of the power-up detector circuit for automatic power reduction after a power-up voltage level is detected.

6. The POR circuit of claim 4, wherein the first RC delay circuit is configured to prevent multiple voltage crossing between two inputs of the first comparator at beginning of the power supply ramp-up.

7. The POR circuit of claim 4, wherein the first comparator has a separate input coupled to a reference voltage coming from a first output of the internal band-gap voltage reference, and wherein the first output of the first resistor ladder is coupled to the second input of the first comparator through the first RC delay circuit during power-up events, and the first comparator is automatically shut down after the power-up voltage level is detected for power saving.

8. The POR circuit of claim 1, wherein the first pull-down network has a first input coupled with the first output of the start-up network, a second input coupled with the second output of the SR latch, a third input coupled with a second output of a second comparator, a first output coupled with the first input of the first RC delay, a second output coupled with the second input of the first comparator and a third output coupled with the first input of the SR latch, wherein the pull-down network inputs are controlled to prevent the first input of the SR latch from starting with the wrong polarity so as not to corrupt states of the SR latch.

9. The POR circuit of claim 8, wherein the pull-down network is configured to ensure the first input of the SR latch does not enter into an undesired set state during an OFF condition of the first resistor ladder and the first comparator.

10. The POR circuit of claim 1, wherein the brownout detector circuit with a first enhanced resistor divider having a first output, a first capacitor coupling the first output to the power supply, a second capacitor coupling the first output to ground and the first output coupled with a second input of a second comparator; the second comparator having a first output coupled to a second input of the SR latch.

11. The POR circuit of claim 10, wherein the well connection of all the resistors in the first enhanced resistor divider are coupled directly to the power supply to speed up voltage detection during brownout events, and the first and second capacitors are configured to speedup the voltage detection by enhancing a frequency response of the enhanced resistor divider.

* * * * *